(12) United States Patent
Lanee et al.

(10) Patent No.: US 7,824,146 B2
(45) Date of Patent: Nov. 2, 2010

(54) AUTOMATED SYSTEMS AND METHODS FOR ADAPTING SEMICONDUCTOR FABRICATION TOOLS TO PROCESS WAFERS OF DIFFERENT DIAMETERS

(75) Inventors: Khamsidi Lanee, Austin, TX (US); Gerry Moore, Valley Mills, TX (US)

(73) Assignee: Advanced Technology Development Facility, Austin, TX (US)

( * ) Notice: Subject to any disclaimer, the term of this patent is extended or adjusted under 35 U.S.C. 154(b) by 166 days.

(21) Appl. No.: 11/851,663

(22) Filed: Sep. 7, 2007

(65) Prior Publication Data

US 2009/0067954 A1 Mar. 12, 2009

(51) Int. Cl.
*H01L 21/677* (2006.01)
(52) U.S. Cl. ................................ 414/804; 414/805
(58) Field of Classification Search .......... 414/804–805
See application file for complete search history.

(56) References Cited

U.S. PATENT DOCUMENTS

| | | | |
|---|---|---|---|
| 5,980,187 A * | 11/1999 | Verhovsky | 414/416.03 |
| 6,331,095 B1 * | 12/2001 | Hiroki | 414/222.01 |
| 6,676,761 B2 * | 1/2004 | Shang et al. | 118/728 |
| 6,887,317 B2 * | 5/2005 | Or et al. | 118/728 |
| 2004/0139917 A1 * | 7/2004 | Yamaguchi et al. | 118/728 |

* cited by examiner

*Primary Examiner*—Saúl J Rodríguez
*Assistant Examiner*—Jonathan D Snelting
(74) *Attorney, Agent, or Firm*—Fulbright & Jaworski L.L.P.

(57) ABSTRACT

Automated systems and methods for adapting semiconductor fabrication tools to process wafers of different diameters are described. In one embodiment, a method comprises providing a semiconductor fabrication tool, placing an adapter ring on a plurality of ring holders via a robotic arm, the plurality of ring holders being operable to support the adapter ring at a vertical distance from a stage heater and the stage heater being movable in a vertical direction, placing a first semiconductor wafer on the stage heater via the robotic arm, the first semiconductor wafer having a first diameter, and moving the stage heater upward to receive the adapter ring from the plurality of ring holders and to cover a portion of the stage heater during processing of the first semiconductor wafer.

2 Claims, 7 Drawing Sheets

AUTOMATED SYSTEMS AND METHODS FOR ADAPTING SEMICONDUCTOR FABRICATION TOOLS TO PROCESS WAFERS OF DIFFERENT DIAMETERS

BACKGROUND OF THE INVENTION

1. Field of the Invention

The present invention relates generally to semiconductor processing and, more particularly, to automated systems and methods for adapting semiconductor fabrication tools to process wafers of different diameters.

2. Description of Related Art

The semiconductor industry is subject to constant technological advances. One relatively recent improvement has been the introduction of 300 mm wafer processing. Manufacturing tools that had been fabricating integrated circuits on wafers having diameters of 200 mm are now in the process of being replaced with tools capable of processing 300 mm wafers. However, due to the high costs involved in building 300 mm wafer fabrication plants from the ground up, many manufacturers have instead chosen to upgrade their existing 200 mm tools to enable them to process 300 mm wafers. Accordingly, equipment suppliers currently offer 200 mm to 300 mm and 300 mm to 200 mm bridge tools or conversion kits.

The amount of time it takes to complete a conversion of a single chamber tool between different wafer sizes is typically about 12 to 16 hours. And, depending upon particular requirements and complexity of applications, it may take even longer. Generally speaking, the conversion includes changing or removing certain parts within the chamber to accommodate the required wafer size. These parts include, for example, adapter rings and the like. Replacing or removing chamber parts requires that the chamber be opened. Further, opening the chamber requires that it be cooled down to room temperature and that its interior gases be vented to the atmosphere.

BRIEF SUMMARY OF THE INVENTION

The present invention provides automated systems and methods for adapting semiconductor fabrication tools to process wafers of different diameters. In one embodiment, a method comprises providing a semiconductor fabrication tool, placing an adapter ring on a plurality of ring holders via a robotic arm, the plurality of ring holders being operable to support the adapter ring at a vertical distance from a stage heater and the stage heater being movable in a vertical direction, placing a first semiconductor wafer on the stage heater via the robotic arm, the first semiconductor wafer having a first diameter, and moving the stage heater upward to receive the adapter ring from the plurality of ring holders and to cover a portion of the stage heater during processing of the first semiconductor wafer.

In another embodiment, a semiconductor fabrication tool comprises an adapter ring operable to cover a portion of a stage heater during a processing of a first semiconductor after having a first diameter, the first diameter being smaller than a diameter of the stage heater and the stage heater being operable to move in a vertical direction; and a plurality of ring holders operable to hold the adapter ring at a vertical distance from the stage heater while a robotic arm places the first semiconductor wafer on the stage heater.

In yet another embodiment, a method comprises providing a semiconductor fabrication tool comprising a stage heater having a plurality of wafer lifts, a baffle surrounding the stage heater and having a plurality of ring lifts, and an arm lift having a plurality of wafer lift pins and a plurality ring lift pins, the plurality of ring lift pins being aligned with the plurality of ring lifts and the plurality of wafer lift pins being aligned with the plurality of wafer lifts; moving the arm lift upward to cause the plurality of ring lift pins to raise the plurality of ring lifts and to cause the plurality of wafer lift pins to raise the plurality of wafer lifts; placing an adapter ring on the plurality of ring lifts via a robotic arm; placing a first semiconductor wafer having a first diameter on the plurality of wafer lifts via the robotic arm; and moving the arm lift downward to lower the plurality of wafer lifts and the plurality of ring lifts, thus resting the first semiconductor wafer and adapter ring on a surface of the stage heater, the adapter ring covering a portion of the stage heater.

In still another embodiment, a semiconductor fabrication tool comprises a stage heater having a plurality of wafer lifts; a baffle surrounding the stage heater and having a plurality of ring lifts; and an arm lift having a plurality of wafer lift pins and a plurality ring lift pins, the plurality of ring lift pins being aligned with the plurality of ring lifts and the plurality of wafer lift pins being aligned with the plurality of wafer lifts.

The term "coupled" is defined as connected, although not necessarily directly, and not necessarily mechanically. The terms "a" and "an" are defined as one or more unless this disclosure explicitly requires otherwise. The terms "substantially," "approximately," "about," and variations thereof are defined as being largely but not necessarily wholly what is specified, as understood by a person of ordinary skill in the art. In one non-limiting embodiment, the term substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but it may also be configured in ways other than those specifically described herein.

BRIEF DESCRIPTION OF THE SEVERAL VIEWS OF THE DRAWINGS

For a more complete understanding of the present invention, reference is now made to the following drawings, in which.

DETAILED DESCRIPTION OF THE INVENTION

In the following detailed description, reference is made to the accompanying drawings that illustrate embodiments of the present invention. These embodiments are described in sufficient detail to enable a person of ordinary skill in the art to practice the invention without undue experimentation. It should be understood, however, that the embodiments and examples described herein are given by way of illustration only, and not by way of limitation. Various substitutions, modifications, additions, and rearrangements may be made without departing from the spirit of the present invention. Therefore, the description that follows is not to be taken in a limited sense, and the scope of the present invention is defined only by the appended claims.

Figure 1A:
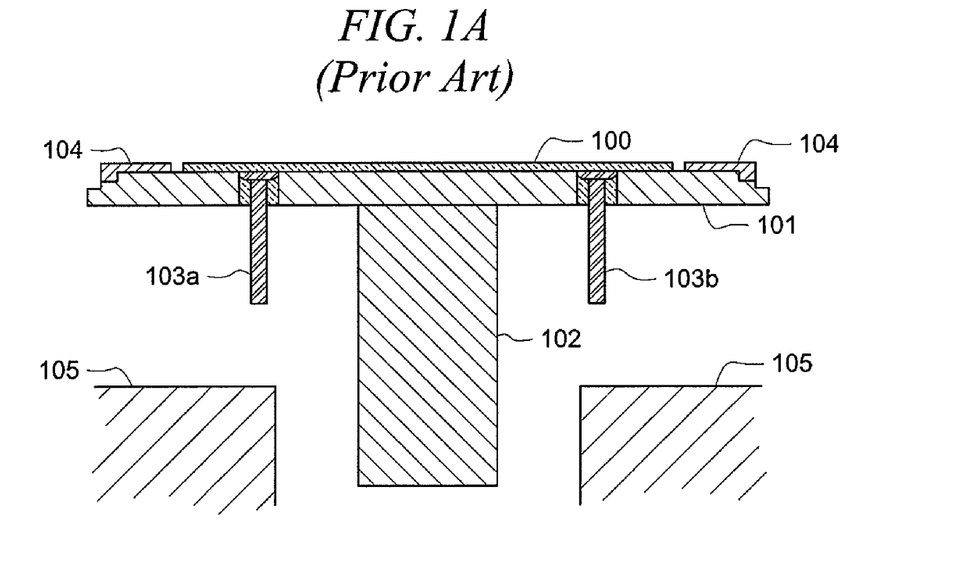
FIGS. 1A and B are cross-section views of prior art 300 mm semiconductor fabrication tools manually adaptable to process 200 mm wafers.
Figure 1B:
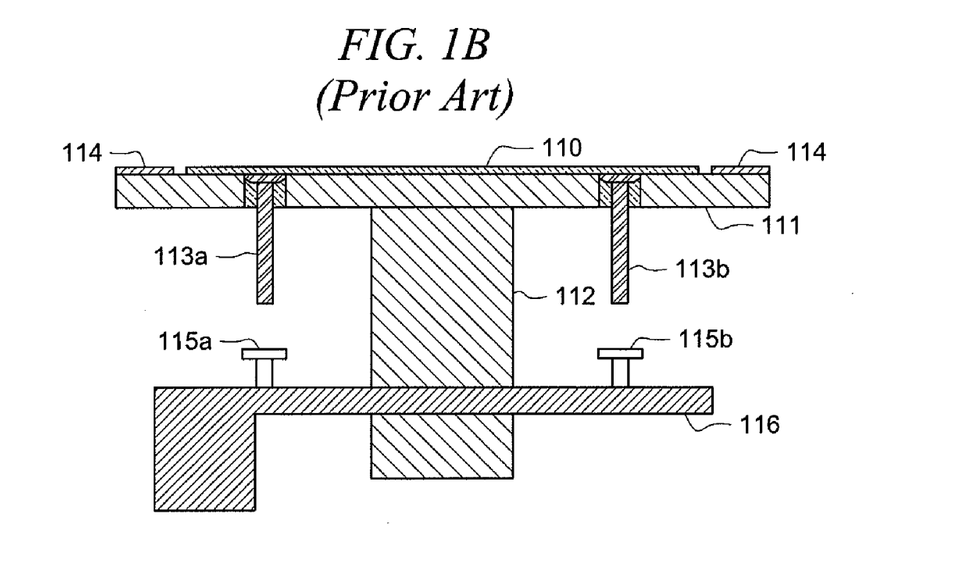

FIGS. 1A and B show cross-section views of prior art 300 mm semiconductor fabrication tools manually adaptable to process 200 mm wafers. Particularly, FIG. 1A shows 200 mm wafer 100 placed on stage heater 101 along with adapter ring 104 during a processing step. The primary function of adapter ring 104 is to protect stage heater 101 from the undesirable deposition of chemicals and reactants over otherwise uncovered portions thereof during the processing of 200 mm wafer 100. After processing of wafer 100 is complete, shaft 102 moves downward and lift stop surface 105 causes wafer lifts 103a and 103b to push wafer 100 upward from the surface of stage heater 101, thus allowing wafer 100 to be removed with a robotic arm (not shown). Another 200 mm wafer may be placed on wafer lifts 103a and 103b, and shaft 102 may then move upwards in to allow this new wafer to rest against the surface of stage heater 101 for its normal processing.

Similarly as described above, FIG. 1B shows 200 mm wafer 110 placed on stage heater 111 along with adapter ring 114. In this example, however, shaft 112 is stationary and arm lift 116 moves vertically to cause wafer lift pins 115a and 115b to interact with wafer lifts 113a and 113b. For example, arm lift 116 may move up to push wafer 110 upward from the surface of stage heater 111 and to allow a robotic arm (not shown) to remove it from the tool. When a new wafer is positioned over raised wafer lifts 113a and 113b, arm lift 116 may then retreat to a lower position, thus allowing the new wafer to rest against the surface of stage heater 111.

Both semiconductor processing tools shown in FIGS. 1A and 1B are capable of processing 300 mm wafers. Before a 300 mm wafer is placed on stage heaters 101 and 111, however, adapter rings 104 and 114 must be manually removed from the tool. And, as previously noted, the manual insertion and removal or adapter rings 104 and 114 (for processing 200 mm and 300 mm wafers, respectively), is generally accompanied by significant drawbacks.

Figure 2:
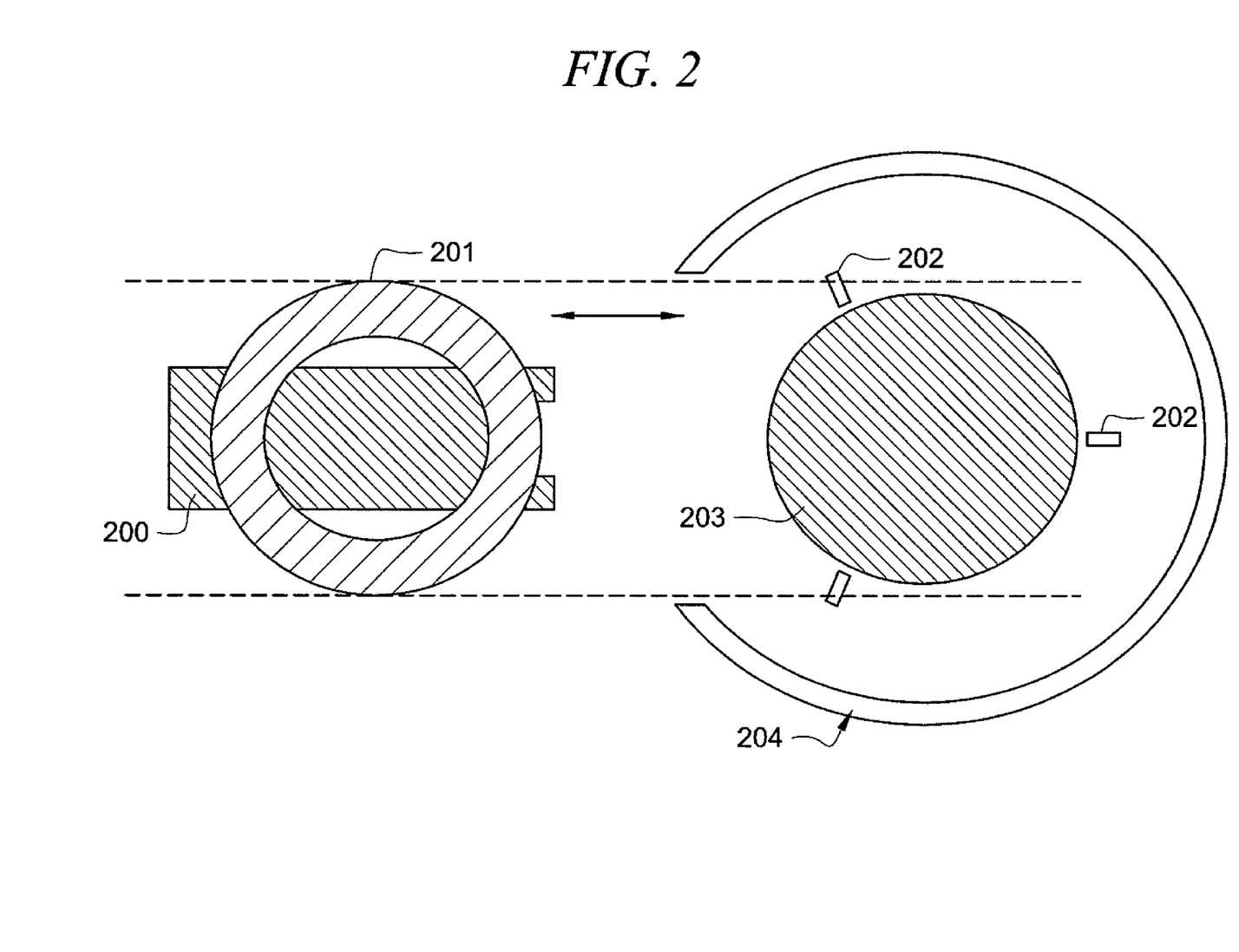
FIG. 2 is a top view of a robot arm operable to carry an adapter ring into and out of a vacuum chamber of a semiconductor fabrication tool, according to an illustrative embodiment of the present invention.

Turning now to FIG. 2, a top view of robotic arm 200 operable to carry adapter ring 201 into and out of vacuum chamber 204 of a semiconductor fabrication tool is depicted according to an illustrative embodiment of the present invention. Robotic arm 200 may carry adapter ring 201 in or out of chamber 204 upon command of a controller (not shown). Adapter ring 201 is placed over stage heater 203 and it may be aligned with respect to one or more bevels 202 before processing of 200 mm wafers. When the processing of 300 mm wafers is desired, robot arm 200 may retrieve adapter ring 201 from chamber 204.

Figure 3A:
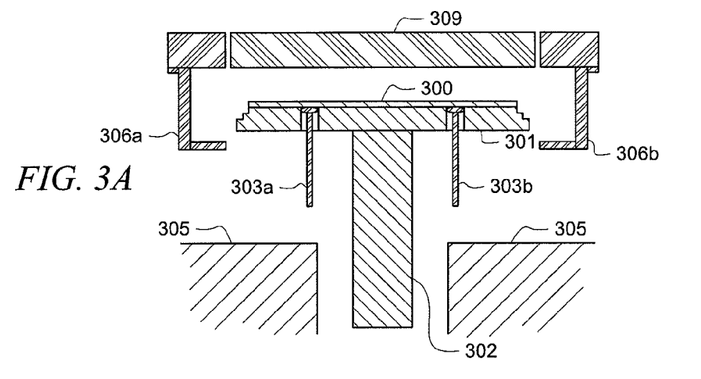
FIGS. 3A-C are cross-section views of a semiconductor fabrication tool with a movable stage heater adapted to process wafers of different diameters, according to an illustrative embodiment of the present invention.
Figure 3B:
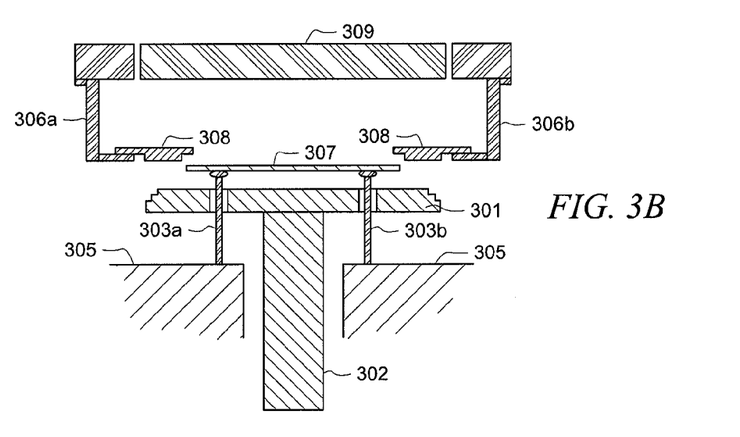
Figure 3C:
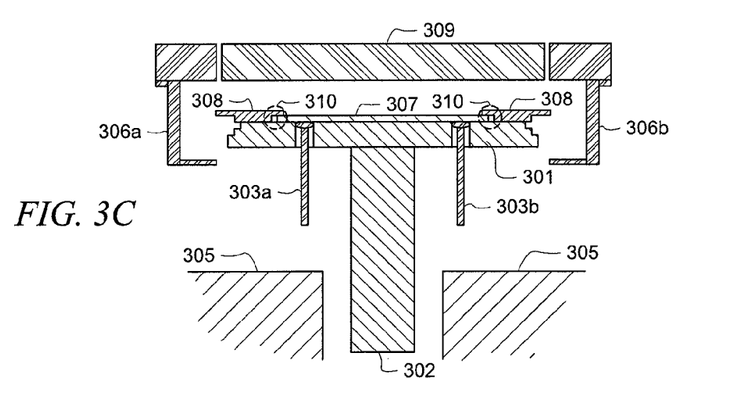

FIGS. 3A-C show cross-section views of a semiconductor fabrication tool with movable stage heater 301 operable to process wafers of different diameters, according to an embodiment of the present invention. Particularly, FIG. 3A illustrates 300 mm wafer 300 placed on the surface of 300 mm stage heater 301 and ready for processing by showerhead 309. Stage heater 301 has wafer lifts 303a and 303b that interact with stop surface 305 as shaft 302 moves in the vertical direction to allow a robotic arm (similar to robotic arm 200 one depicted in FIG. 2) to place (and remove) 300 mm wafer 300 on the tool. Showerhead 309 also has a plurality of adapter ring holders 306a and 306b attached thereto. Holders 306a and 306b are operable to hold adapter ring 308 during the processing of 200 mm wafers, as described below.

FIG. 3B shows 200 mm wafer 307 placed on wafer lifts 303a and 303b, as well as adapter ring 308 placed on adapter ring holders 306a and 306b, when shaft 302 is in a lowered position. Wafer 307 and ring 308 may be placed in the tool using a robotic arm. FIG. 3C shows 200 mm wafer 307 being processed by showerhead 309 while adapter ring 308 protects the outer edge of stage heater 301 when shaft 302 is in a higher position. In one embodiment, adapter ring 308 may have edge exclusion 310 of approximately 1 to 2 mm to cover a small portion of the edge of wafer 307 in order to further protect stage heater 301 by avoiding "wrap-around" deposition that would otherwise accumulate over time in the gap between wafer 307 and adapter ring 308.

After processing of wafer 307 is complete, shaft 302 may return to a lowered position as shown in FIG. 3B and robotic arm 200 may remove it from the tool. Thereafter, robotic arm 200 may place a new 200 mm wafer on wafer lifts 303a and 303b for processing. Alternatively, robotic arm 200 may remove adapter ring 308 from the ring holders 306a and 306b and insert a 300 mm wafer into the chamber as shown in FIG. 3A.

Figure 3D:
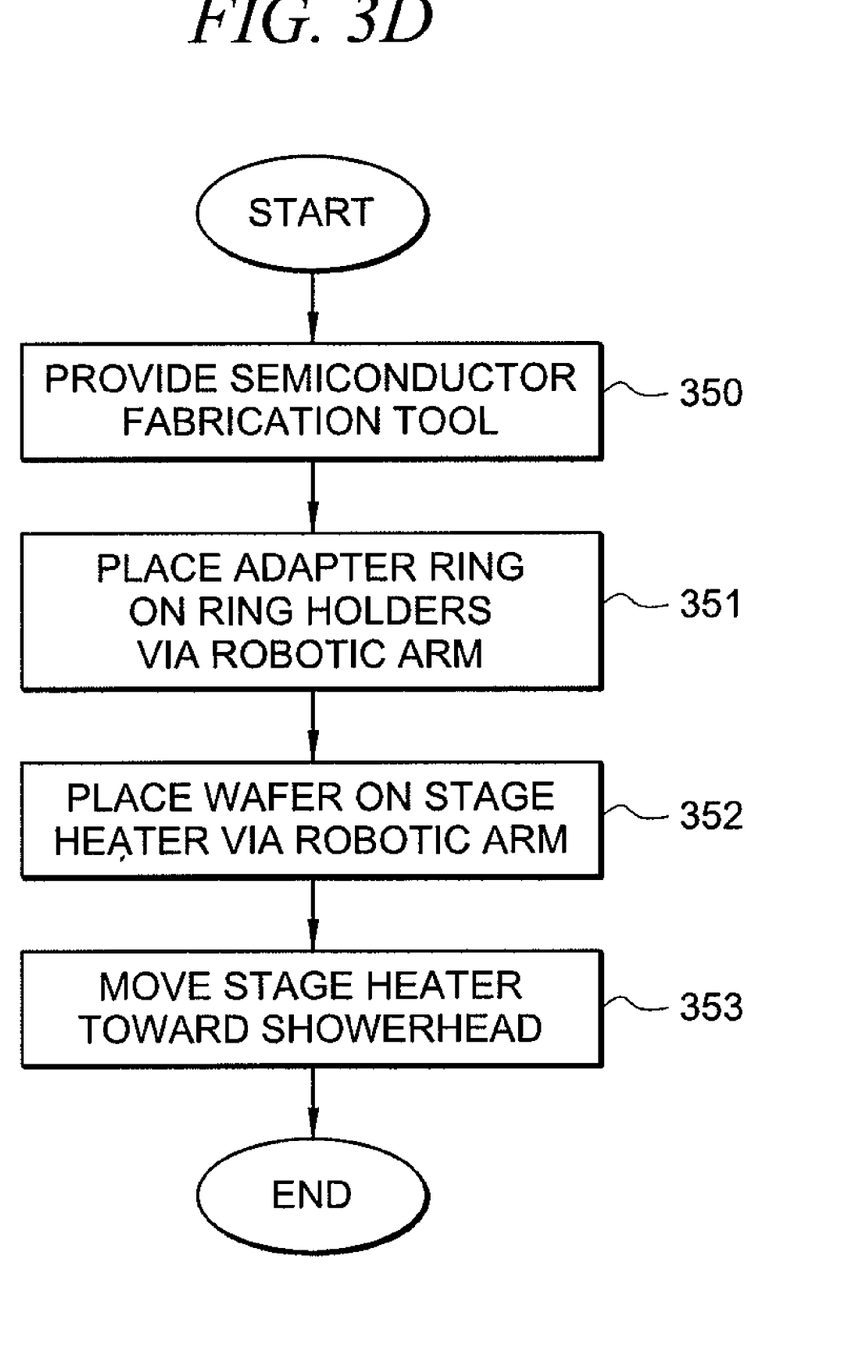
FIG. 3D is a flowchart of an automated method for operating the semiconductor fabrication tool of FIGS. 3A-C, according to an illustrative embodiment of the present invention.

FIG. 3D is a flowchart of an automated method for operating the semiconductor fabrication tool of FIGS. 3A-C according to an illustrative embodiment of the present invention. In step 350, a semiconductor fabrication tool is provided. In step 351, adapter ring 308 is placed on ring holders 306a and 306b via robotic arm 200. Ring holders 306a and 306b are operable to support adapter ring 308 at a vertical distance from stage heater 301, which is movable in a vertical direction. Robotic arm 200 then places wafer 307 having a first diameter (e.g., 200 mm) on stage heater 301 in step 352. Stage heater 301 then moves toward showerhead 309 to receive adapter ring 308 from ring holders 306a and 306b, thus covering a peripheral portion of stage heater 301 during processing of wafer 307. In one embodiment, all of steps 350-353 are performed while maintaining a vacuum chamber of the semiconductor fabrication tool closed.

In certain embodiments, the automated method of FIG. 3D may further comprise steps including, for example, moving stage heater 301 away from showerhead 309 to return adapter ring 308 to ring holders 306a and 306b, removing wafer 307 from stage heater 301 via robotic arm 200, removing adapter ring 308 from ring holders 306a and 306b via robotic arm 200, placing new semiconductor wafer 300 on stage heater 301 via robotic arm 200, this new wafer having a diameter greater than the first diameter (e.g., 300 mm), and moving stage heater 301 toward showerhead 309 to process wafer 300.

Figure 4A:
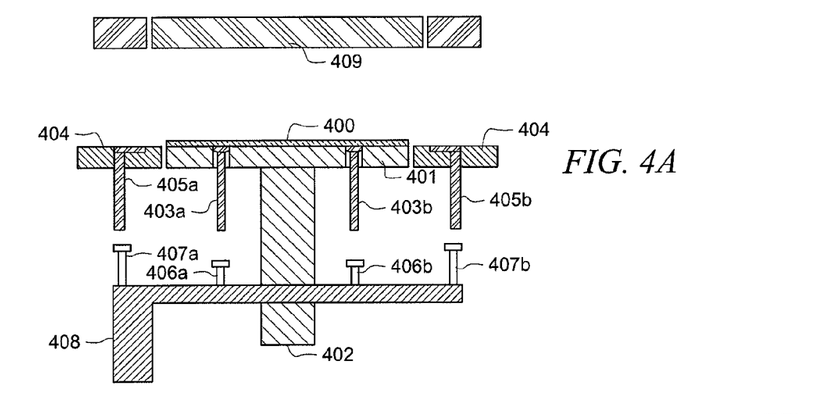
FIGS. 4A-C are cross-section views of a semiconductor fabrication tool having an arm lift adapted to process wafers of different diameters, according to an illustrative embodiment of the present invention.
Figure 4B:
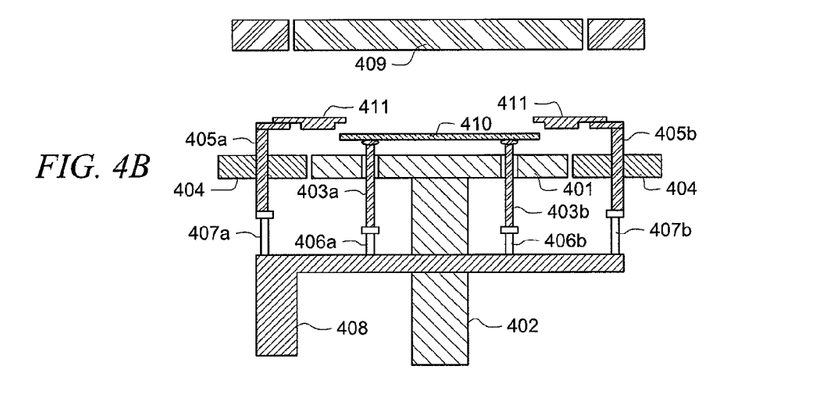
Figure 4C:
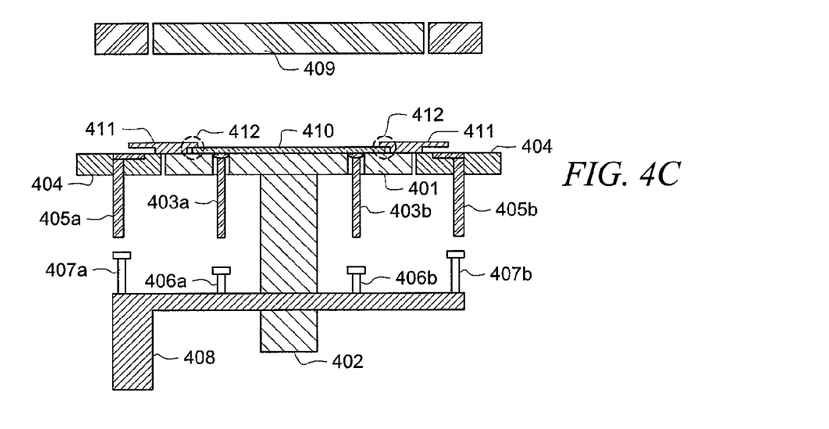

FIGS. 4A-C are cross-section views of a semiconductor fabrication tool having arm lift 408 operable to process wafers of different diameters, according to an illustrative embodiment of the present invention. Particularly, FIG. 4A shows 300 mm wafer 400 placed on the surface of 300 mm stage heater 401 and ready for processing by showerhead 409. Stage heater 401 has wafer lifts 403a and 403b aligned with wafer lift pins 406a and 406b of arm lift 408 and it may be stationary. Further, stage heater 401 may be stationary. Baffle 404 surrounding stage heater 401 has a plurality of ring lifts 405a and 405b aligned with ring lift pins 407a and 407b of arm lift 408, respectively. When arm lift 408 moves upward in the vertical direction and on the same axis as shaft 402, ring lift pins 407a and 407b raise ring lifts 405a and 405b, respectively, and wafer lift pins 406a and 406b raise wafer lift pins 403a and 403b, respectively. In one embodiment, the height of ring lift pins 407a and 407b is greater than the height of wafer lift pins 406a and 406b so that adapter ring 411 may float or be held above wafer 410 as described below. In other embodiments where adapter 411 does not have an edge exclusion, the height of wafer lift pins 406a and 406b may be greater than the height of ring lift pins 407a and 407b so that wafer 410 is held above adapter ring 411. Alternatively, the height of ring lift pins 407a and 407b may be approximately the same as the height of wafer lift pins 406a and 406b so that adapter ring 411 is held at approximately the same level as wafer 410.

FIG. 4B shows 200 mm wafer 410 placed on wafer lifts 403a and 403b and adapter ring 411 placed on ring lifts 405a and 405b when arm lift 408 is in a raised position. Accordingly, wafer lift pins 406a and 406b push wafer lifts 403a and 403b and ring lift pins 407a and 407b push adapter ring 411 away from stage heater 401. Wafer 410 and adapter ring 411 may be placed in the tool using robotic arm 200. FIG. 4C shows wafer 410 being processed when arm lift 408 retreats to a lower position so that wafer 401 and adapter ring 411 rest on the surface of stage heater 401. Similarly as described above, adapter ring 411 may have edge exclusion 412 of approximately 1 to 2 mm in order to further protect stage heater 401.

After processing of wafer 401 is complete, arm lift 408 may return to a raised position as shown in FIG. 4B and robotic arm 200 may remove it from the tool. Thereafter, robotic arm 200 may place a new 200 mm wafer on wafer lifts 403a and 403b for processing. Alternatively, robotic arm 200 may also remove adapter ring 411 from the ring lifts 305a and 305b and insert a 300 mm wafer into the chamber as shown in FIG. 4A.

Figure 4D:
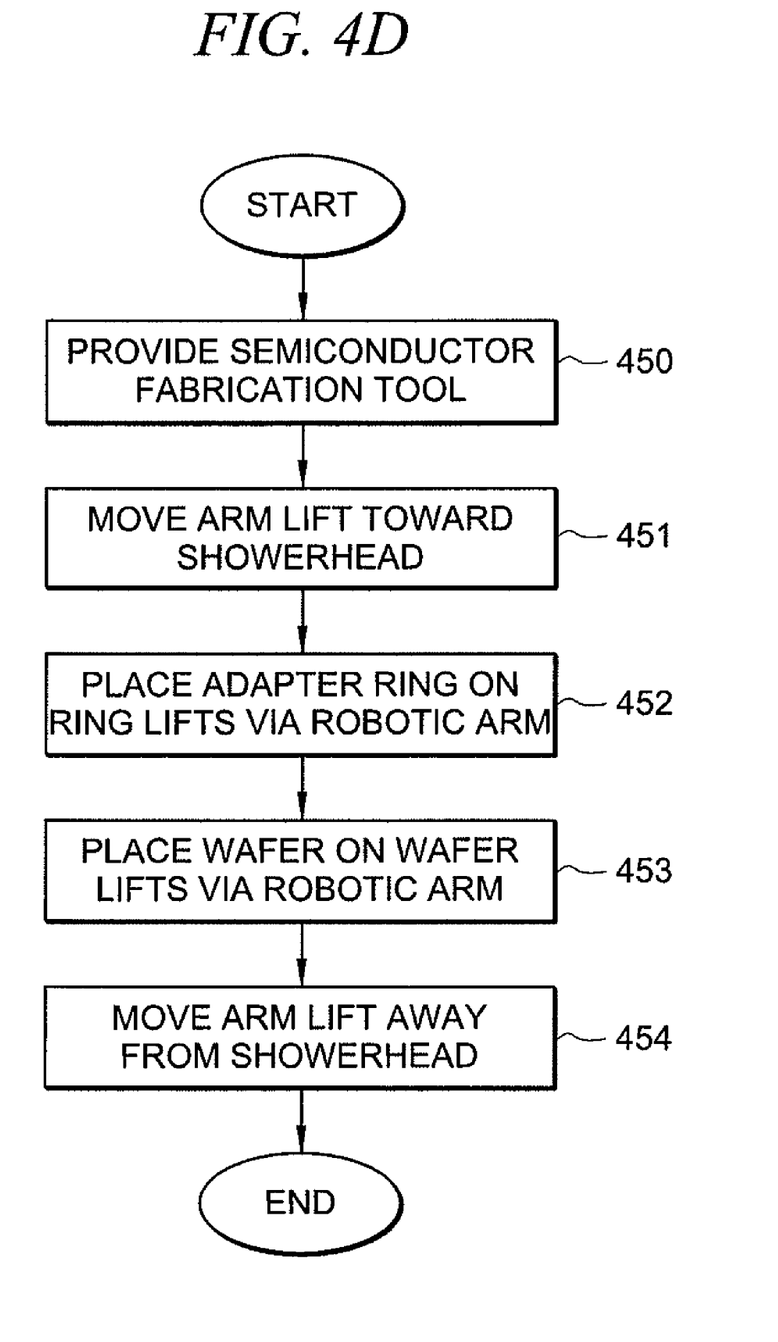
FIG. 4D is a flowchart of an automated method for operating the semiconductor fabrication tool of FIGS. 4A-C, according to an illustrative embodiment of the present invention.

FIG. 4D is a flowchart of a method for operating the semiconductor fabrication tool of FIGS. 4A-C according to an illustrative embodiment of the present invention. In step 450, a semiconductor fabrication tool is provided. In one embodiment, the semiconductor fabrication tool comprises showerhead 409, stage heater 401 having wafer lifts 403a and 403b, baffle 404 surrounding stage heater 401 and having ring lifts 405a and 405b, and arm lift 408 having wafer lift pins 406a and 406b and ring lift pins 407a and 407b. Ring lift pins 407a and 407b may be aligned with ring lifts 405a and 405b, respectively, and wafer lift pins 406a and 406b may be aligned with wafer lifts 403a and 403b, respectively.

In step 451, arm lift 408 is moved in vertical direction toward showerhead 409 to cause ring lift pins 407a and 407b to raise ring lifts 405a and 405b and to cause wafer lift pins 406a and 406b to raise the plurality of wafer lifts 403a and 403b. Adapter ring 411 is placed on ring lifts 405a and 405b via robotic arm 200 in step 452. Then, semiconductor wafer 410 having a first diameter (e.g., 200 mm) is placed on wafer lifts 403a and 403b via robotic arm 200 in step 453. In step 454, arm lift 408 may be moved in the vertical direction away from showerhead 409 to lower wafer lifts 403a and 403b and ring lifts 405a and 405b, thus resting wafer 410 and adapter ring 411 on a surface of stage heater 401, adapter ring 411 covering a portion of stage heater 401. In one embodiment, all of steps 450-454 are performed while maintaining a vacuum chamber of the semiconductor fabrication tool closed.

In certain embodiments, the automated method of FIG. 4D may further comprise steps including, for example, moving arm lift 408 in the vertical direction toward showerhead 409 to cause ring lift pins 407a and 407b to raise ring lifts 405a and 405b and to cause wafer lift pins 406a and 406b to raise wafer lifts, removing wafer 410 from wafer lifts 405a and 406a via robotic arm 200, removing adapter ring 411 from ring lifts 405a and 405b via robotic arm 200, placing a second semiconductor wafer 410 with a diameter greater than the diameter of wafer 411 on wafer lifts 405a and 406a via robotic arm 200, and moving arm lift 408 in the vertical direction away from showerhead 409 to place wafer 411 on the surface of stage heater 401.

In one embodiment, robotic arm 200, movable stage heater 301 (along with shaft 302), and/or arm lift 408 may be operable under command of a controller or computer to perform at least portions of methods described in FIGS. 3D and 4D. As such, some of the functions and algorithms described herein may be implemented, for example, as software or as a combination of software and human implemented procedures. The software may comprise instructions executable on a digital signal processor (DSP), application-specific integrated circuit (ASIC), microprocessor, or any other type of processor. The software implementing various embodiments of the present invention may be stored in a computer readable medium of a computer program product. The term "computer readable medium" includes any medium that can store or transfer information. Examples of the computer program products include an electronic circuit, semiconductor memory device, random access memory (RAM), static RAM (SRAM), dynamic RAM (DRAM), synchronous DRAM (SDRAM), read only memory (ROM), erasable ROM (EROM), erasable programmable ROM (EPROM), electrically erasable programmable ROM (EEPROM), flash memory, floppy diskette, compact disk (CD), optical disk, hard disk, or the like. The software may be downloaded via computer networks such as the Internet or the like.

Figure 5:
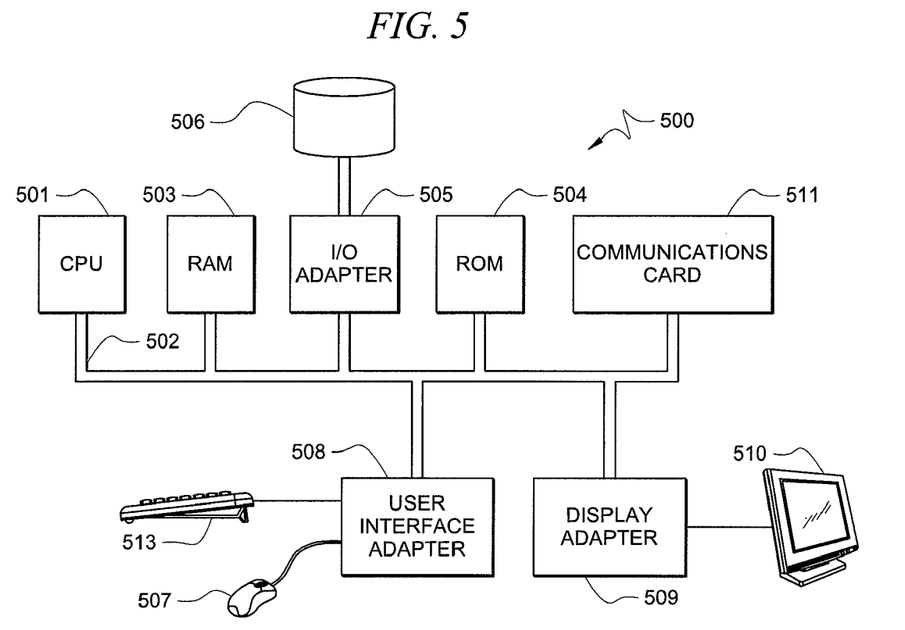
FIG. 5 is a block diagram of a computer operable to implement functions according to illustrative embodiments of the present invention.

FIG. 5 illustrates a computer system adapted to implement certain embodiments of the present invention (e.g., storing and/or executing software associated with these embodiments). Central processing unit (CPU) 501 is coupled to system bus 502. CPU 501 may be any general purpose CPU. However, embodiments of the present invention are not restricted by the architecture of CPU 501 as long as CPU 501 supports the inventive operations as described herein. Bus 502 is coupled to RAM 503, which may be SRAM, DRAM, or SDRAM. ROM 504 is also coupled to bus 502, which may be PROM, EPROM, or EEPROM.

Bus 502 is also coupled to input/output ("I/O") controller card 505, communications adapter card 511, user interface card 508, and display card 509. I/O adapter card 505 connects storage devices 506, such as one or more of a hard drive, a CD drive, a floppy disk drive, a tape drive, to computer system 500. I/O adapter 505 is also connected to a printer (not shown), which would allow the system to print paper copies of information such as documents, photographs, articles, and the like. Note that the printer may be a printer (e.g., dot matrix, laser, and the like), a fax machine, scanner, or a copier machine. Communications card 511 is adapted to couple the computer system 500 to robotic arm 200, movable stage heater 301 (along with shaft 302), and/or arm lift 408. User interface card 508 couples user input devices, such as keyboard 513, pointing device 507, and the like, to computer system 500. Display card 509 is driven by CPU 501 to control the display on display device 510.

As a person of ordinary skill in the art will immediately recognize in light of this disclosure, the systems and methods described above provide numerous advantages over the prior art. For example, the present invention provides automated systems and methods for adapting a semiconductor fabrication tool to process wafers of different diameters. This enables continuous production and avoids the need to periodically halt operations in order to open the vacuum chamber and manually insert or remove adapter rings from the tool.

Accordingly, certain embodiments of the present invention eliminate the need to cool down and venting the chamber to atmospheric pressure when performing a conversion operation. Using the robotic arm in the transfer chamber under vacuum allows the integrity of the chamber to be maintained, and allows the temperature to be kept at process temperature. Along with the significant amount of time saved with not having to cool down the chamber, the elimination of extreme temperature and chamber pressure cycling maintains stability in the process chamber, which also avoids other possible issues such as particles contamination etc., and extends the lifetime of the typically expensive components residing in the chamber. Moreover, some of the embodiments disclosed herein may be implemented in a variety of tools such as, for example, chemical vapor deposition (CVD), physical vapor deposition (PVD), and atomic layer deposition (ALD) tools, among others. Although showerhead 309 and 409 are depicted in FIGS. 3A-C and 4A-C, respectively, the embodiments described herein are also applicable to cross-flow tools or any other single chamber wafer processing tools. In addition, although certain embodiments described herein illustrate the use of 200 mm and 300 mm diameter wafers, wafers of any size may be used, including larger wafers not yet in production and custom-size wafers.

Although certain embodiments of the present invention and their advantages have been described herein in detail, it should be understood that various changes, substitutions and alterations can be made without departing from the spirit and scope of the invention as defined by the appended claims. Moreover, the scope of the present invention is not intended to be limited to the particular embodiments of the processes, machines, manufactures, means, methods, and steps described herein. As a person of ordinary skill in the art will readily appreciate from this disclosure, other processes, machines, manufactures, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufactures, means, methods, or steps.

The invention claimed is:

1. A method comprising:
    providing a semiconductor fabrication tool comprising a stage heater having a plurality of wafer lifts, a baffle surrounding the stage heater and having a plurality of ring lifts, and an arm lift having a plurality of wafer lift pins and a plurality of ring lift pins, the plurality of ring lift pins being aligned with the plurality of ring lifts and the plurality of wafer lift pins being aligned with the plurality of wafer lifts;
    moving the arm lift upward to cause the plurality of ring lift pins to raise the plurality of ring lifts and to cause the plurality of wafer lift pins to raise the plurality of wafer lifts;
    placing an adapter ring on the plurality of ring lifts via a robotic arm;
    placing a first semiconductor wafer having a first diameter on the plurality of wafer lifts via the robotic arm;
    moving the arm lift downward to lower the plurality of wafer lifts and the plurality of ring lifts, thus resting the first semiconductor wafer and adapter ring on a surface of the stage heater, the adapter ring covering a portion of the stage heater,
    removing the first semiconductor wafer from the plurality of wafer lifts via the robotic arm;
    removing the adapter ring from the plurality of ring lifts via the robotic arm;
    placing a second semiconductor wafer on the plurality of wafer lifts via the robotic arm, the second semiconductor wafer having a second diameter greater than the first diameter; and
    moving the arm lift downward to place the second semiconductor wafer on the surface of the stage heater.

2. The method of claim 1, further comprising maintaining a vacuum chamber of the semiconductor fabrication tool closed, the vacuum chamber comprising the stage heater.

* * * * *